United States Patent
Ozawa et al.

(10) Patent No.: US 11,292,964 B2
(45) Date of Patent: Apr. 5, 2022

(54) PHOSPHOR

(71) Applicant: Mitsui Mining & Smelting Co., Ltd., Tokyo (JP)

(72) Inventors: Ikuhiro Ozawa, Ageo (JP); Takayoshi Mori, Ageo (JP); Riko Sato, Ageo (JP); Jun-ichi Itoh, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 279 days.

(21) Appl. No.: 16/084,744

(22) PCT Filed: Feb. 14, 2017

(86) PCT No.: PCT/JP2017/005249
§ 371 (c)(1),
(2) Date: Sep. 13, 2018

(87) PCT Pub. No.: WO2017/159175
PCT Pub. Date: Sep. 21, 2017

(65) Prior Publication Data
US 2019/0071600 A1    Mar. 7, 2019

(30) Foreign Application Priority Data

Mar. 14, 2016   (JP) .............................. JP2016-049313

(51) Int. Cl.
*C09K 11/58*    (2006.01)
*C09K 11/59*    (2006.01)
(Continued)

(52) U.S. Cl.
CPC ............... *C09K 11/59* (2013.01); *C09D 5/29* (2013.01); *C09D 7/40* (2018.01); *C09D 201/00* (2013.01);
(Continued)

(58) Field of Classification Search
CPC ..... C09K 11/717; C09K 11/58; C09K 11/582; C09K 11/59; C09K 11/592
See application file for complete search history.

(56) References Cited

U.S. PATENT DOCUMENTS 5,888,291 A    3/1999   Chopin et al.
7,554,129 B2   6/2009   Roth et al.
(Continued)

FOREIGN PATENT DOCUMENTS

JP    H09504771 A    5/1997
JP    2004526330 A   8/2004
(Continued)

OTHER PUBLICATIONS

Pradell. Physical Processes Involved in Production of the Ancient Pigment, Egyptian Blue. J. Am. Ceram. Soc., 89 [4] 1426-1431 (2006) (Year: 2006).*
(Continued)

*Primary Examiner* — Matthew E. Hoban
(74) *Attorney, Agent, or Firm* — The Webb Law Firm

(57) ABSTRACT

Provided is a new phosphor which can be excited by visible light in a wide band to emit a broad fluorescence spectrum, and also to emit near-infrared light with high intensity. Proposed is a phosphor, which is an oxide comprising Ca, Cu, and Si, wherein the containing molar ratios of the elements are $0.15 \leq Ca/Si < 0.25$ and $0.13 \leq Cu/Si < 0.25$.

15 Claims, 4 Drawing Sheets

(51) Int. Cl.
*C09D 5/29* (2006.01)
*C09D 201/00* (2006.01)
*H01L 33/50* (2010.01)
*C09D 7/40* (2018.01)

(52) U.S. Cl.
CPC ............ *C09K 11/592* (2013.01); *H01L 33/50* (2013.01); *H01L 33/502* (2013.01)

(56) References Cited

U.S. PATENT DOCUMENTS

| | | |
|---|---|---|
| 8,066,909 B2 | 11/2011 | Roth et al. |
| 8,089,084 B2 | 1/2012 | Roth et al. |
| 2003/0063892 A1 | 4/2003 | Beall et al. |
| 2005/0274972 A1 | 12/2005 | Roth et al. |
| 2008/0067472 A1 | 3/2008 | Roth et al. |
| 2008/0067920 A1 | 3/2008 | Roth et al. |
| 2008/0224163 A1 | 9/2008 | Roth et al. |
| 2010/0207132 A1 | 8/2010 | Lee et al. |
| 2010/0301371 A1 | 12/2010 | Roth et al. |
| 2011/0147662 A1 | 6/2011 | Lee et al. |
| 2014/0072790 A1 | 3/2014 | Salguero et al. |

FOREIGN PATENT DOCUMENTS

| | | |
|---|---|---|
| JP | 2005-354027 A | 12/2005 |
| JP | 2008185378 A | 8/2008 |
| WO | 2016140029 A1 | 9/2016 |

OTHER PUBLICATIONS

Chem Tube 3D. Cuprorivaite—CaCuSi4O10—Egyptian Blue. Retrieved from https://www.chemtube3d.com/ss-cacusi4o10-2/ on Aug. 31, 2020.*
Johnson-McDaniel. Nanoscience of an ancient pigment. | J. Am. Chem. Soc. 2013, 135, 1677-1679 (Year: 2012).*
Pabst. Structures of Some Tetragonal Sheet Silicates.Acta Cryst. (1959). 12, 733 (Year: 1959).*
McDaniel. Exfoliation of Egyptian Blue and Han Blue, Two Alkali Earth Copper Silicatebased Pigments. Journal of Visualized Experiments • Apr. 2014 (Year: 2014).*
Kendrick, E., et al., Structure and colour properties in the Egyptian Blue Family, M1-xM'xCuSi4O10, as a function of M, M' where M,M'=Ca, Sr and Ba, Dyes and Pigments, Dec. 5, 2005, pp. 13-18, vol. 73, Elsevier.
Zhuang, Yixi,et al., "Forward and back energy transfer between Cu2+ and Yb3+ in Ca1-xCuSi4O10:Ybx crystals", Journal of Applied Physics, 2012, pp. 093521/1-093521/6 vol. 112, No. 9, American Institute of Physics.
Zhuang, Yixi, et al., "Interactive energy transfer between Cu2+ and Yb3+ in Ca1-xCuSi4O10: Ybx", Physica Status Solidi C: Current Topics in Solid State Physics, 2012, pp. 2304-2307, vol. 9, No. 12, WILEY-VCH.
Li Ya-jie,et al., "Temperature-dependent near-infrared emission of highly concentrated Cu2+ in CaCuSi4O10 phosphor", Journal of Materials Chemistry C, Dec. 28, 2014, pp. 10395-10402, vol. 2 No. 48, The Royal Society of Chemistry.
Johnson-McDaniel, Darrah, et al., "Exfoliation of Egyptian blue and Han blue, two alkali earth copper silicate-based pigments", Journal of Visualized Experiments, 2014, pp. e51686/1-e51686/10, vol. 86.
Chen, Weibo, et al., "Near-infrared emission and photon energy upconversion of two-dimensional copper silicates", Journal of Physical Chemistry C, 2015, pp. 20571-20577, vol. 119, No. 35, American Chemical Society.

\* cited by examiner

[FIG. 1]
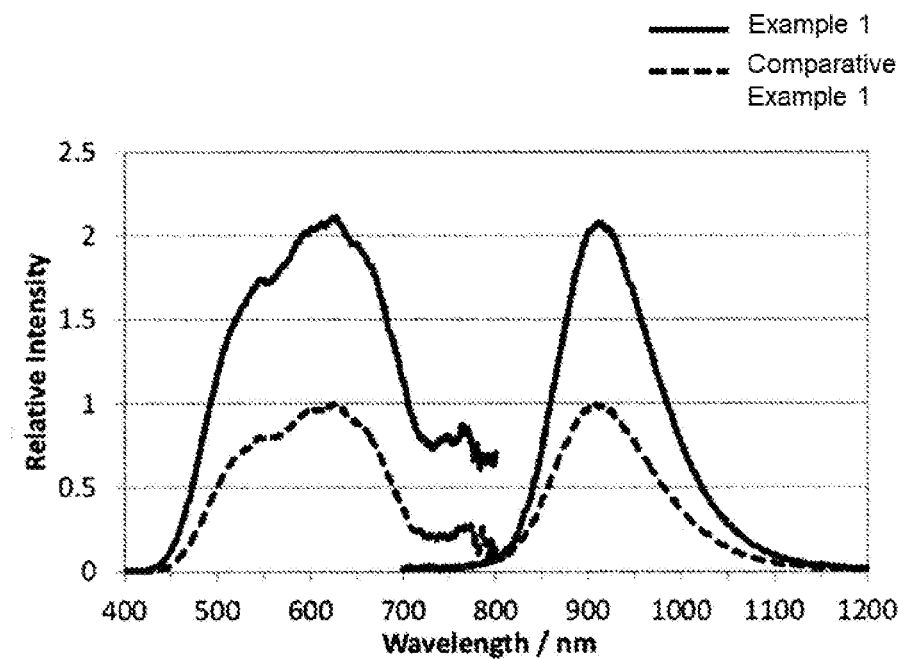
[FIG. 2]
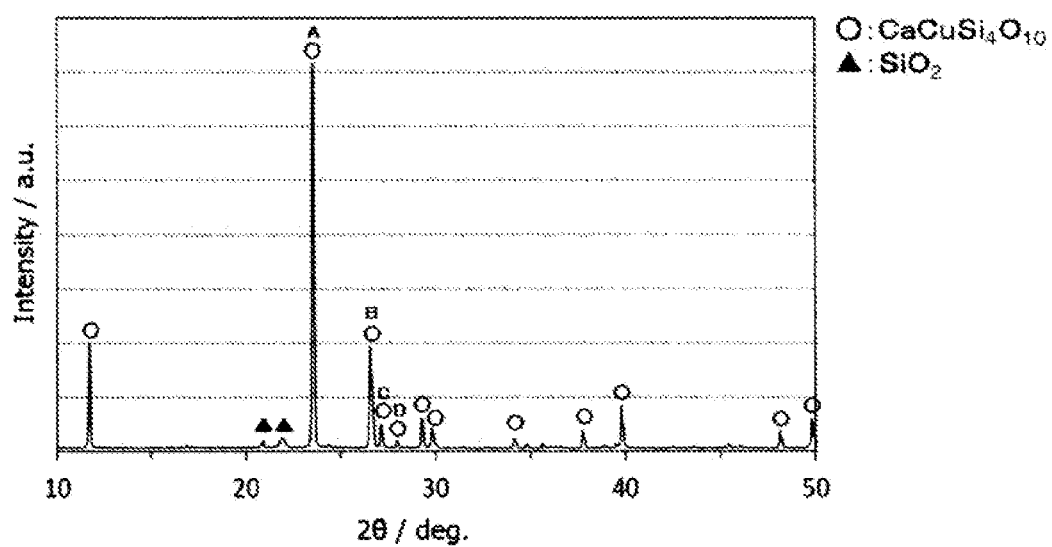

[FIG. 3]
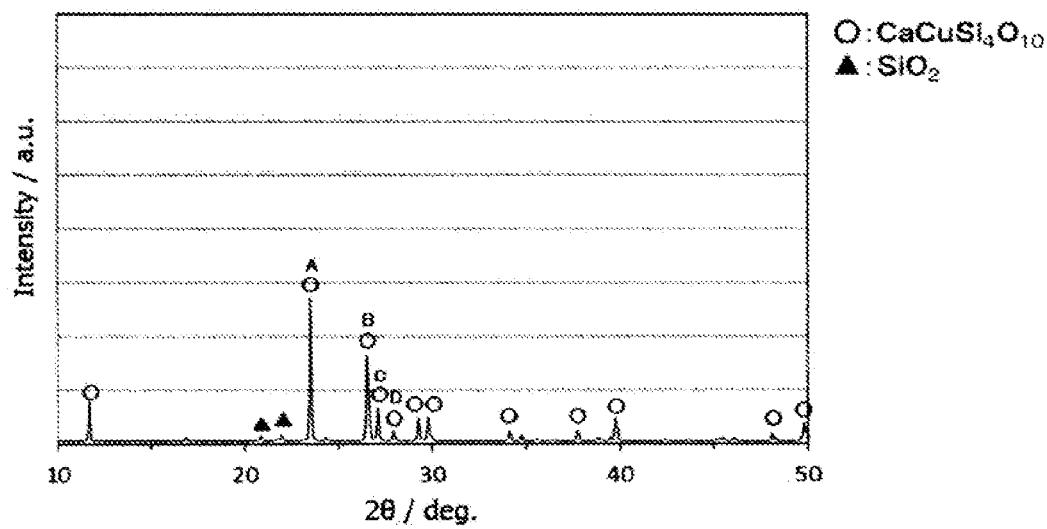
[FIG. 4]
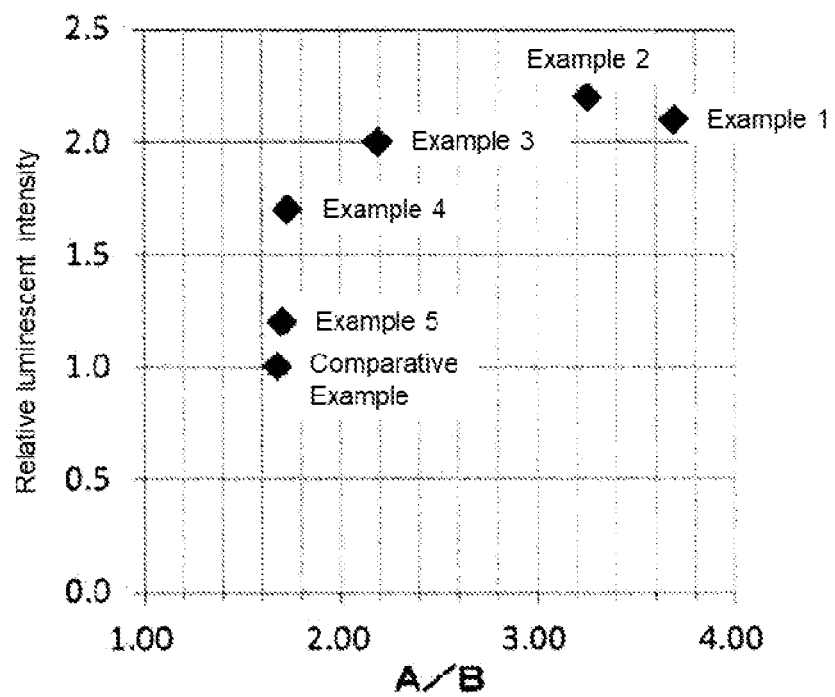

[FIG. 5]
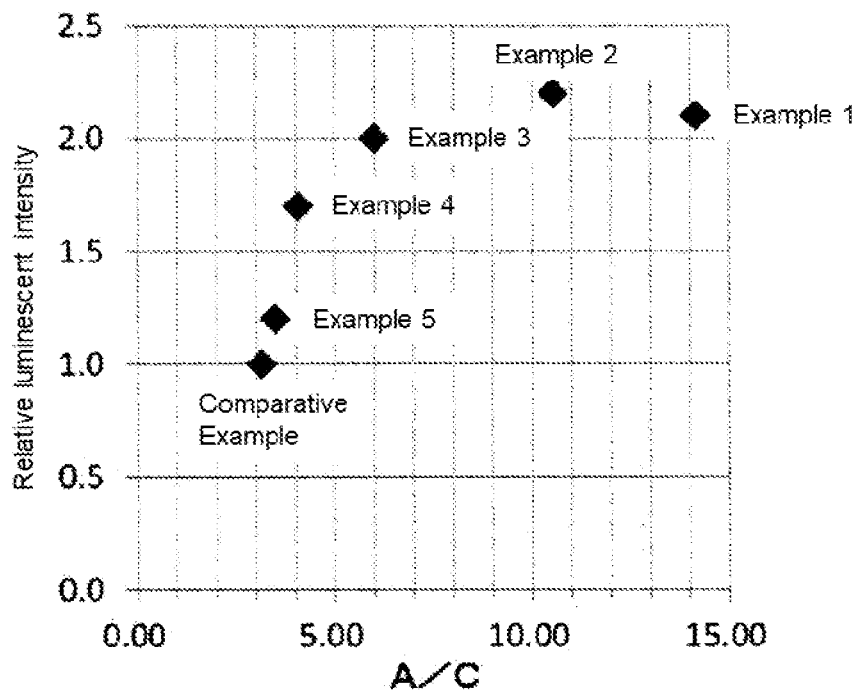
[FIG. 6]
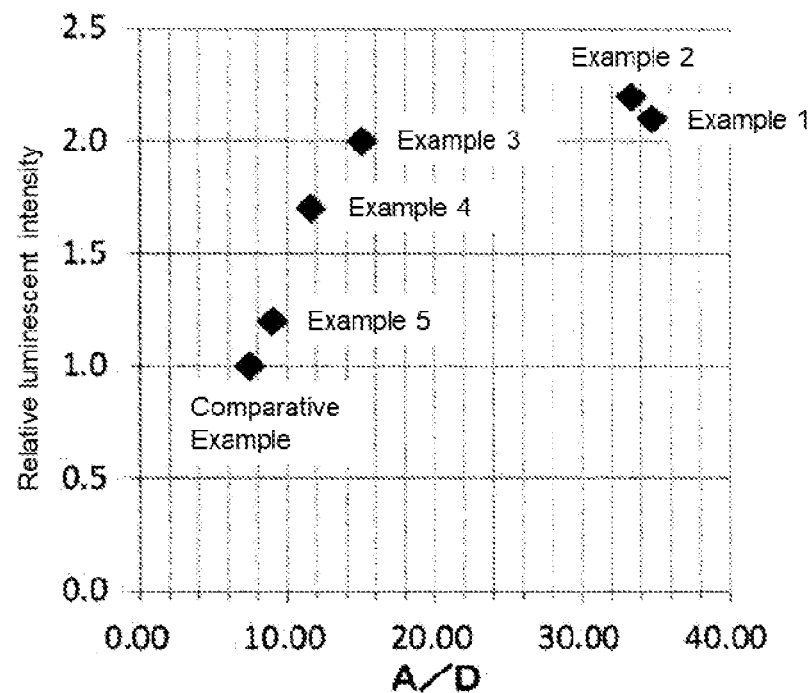

[FIG. 7]
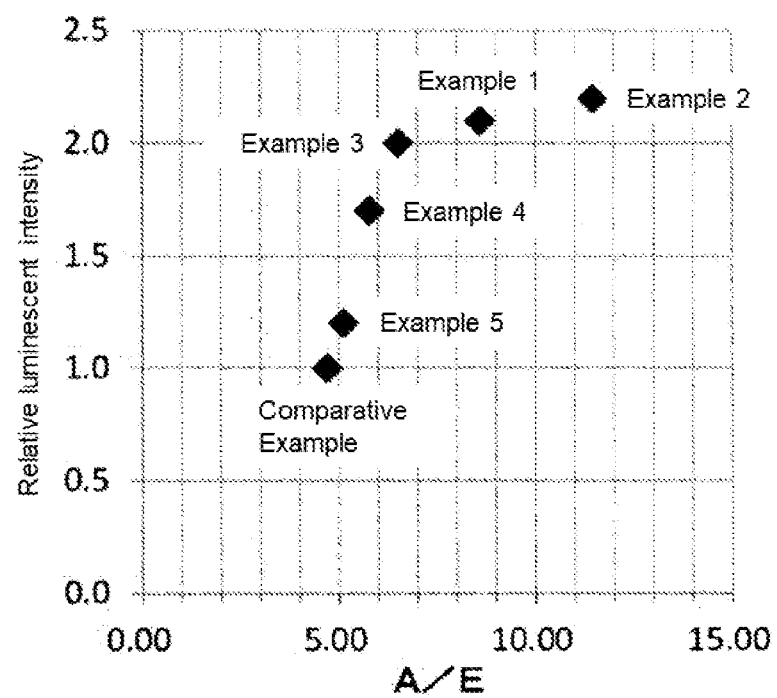

PHOSPHOR

CROSS-REFERENCE TO RELATED APPLICATIONS

This application is the United States national phase of International Application No. PCT/JP2017/005249 filed Feb. 14, 2017, and claims priority to Japanese Patent Application No. 2016-049313 filed Mar. 14, 2016, the disclosures of which are hereby incorporated in their entirety by reference.

TECHNICAL FIELD

The present invention relates to a phosphor, which is excited by visible light, capable of emitting near-infrared light.

BACKGROUND ART

In the case of evaluating objects by using a spectrometer, light in a near-infrared region is less absorbed by moisture. Thus, a near-infrared spectrometer using a near-infrared luminescent device is particularly suitable for evaluating objects, which contain a large amount of water, such as biological objects, fruits, and vegetables.

In addition, since an optical coherence tomography (OCT) uses near-infrared light, the biological damage property thereof is lower than that of a general X-ray tomography, and the spatial resolution of tomographic images is excellent.

Further, in a solar battery or a solar power generator using silicon, since silicon has the most highest photo-responsivity in a near-infrared region, the power generation efficiency can be further enhanced if visible light can be converted into near-infrared light.

Meanwhile, when a phosphor capable of emitting near-infrared light is used, a novel fluorescent paint or fluorescent paint printed product can be developed. For example, conventionally, a UV light fluorescent pigment has been mainly used for forgery-proof printing utilized for paper-money and the like. If this can be replaced with near-infrared fluorescent pigment, novel forgery-proof printing, in which the forgery, which cannot be detected with the naked eye, can be detected by a solid-state imaging device using a photo-diode made of silicon, InGaAs or the like, or equipment using a photomultiplier tube, becomes possible.

As such, it is expected that the near-infrared luminescent phosphor, which is excited by visible light, capable of emitting near-infrared light can be used for various applications in the future.

As to the near-infrared phosphor, for example, Japanese Patent Application Laid-Open No. 2008-185378 conventionally discloses, as an infrared glass phosphor used for an OCT apparatus, a near-infrared luminescent phosphor containing $Yb_2O_3$ and $Nd_2O_3$, further containing glass formed from $Bi_2O_3$ and $B_2O_3$, and being excited by blue light.

Further, Japanese Translation of PCT International Application Publication No. 2004-526330 discloses a near-infrared luminescent body, which is excited by near-infrared light with a glass-ceramic material in which transition metal ions are doped, and proposes the utilization to an OCT apparatus.

SUMMARY OF THE INVENTION

Problem to be Solved by the Invention

As a conventional near-infrared phosphor, materials using rare earth trivalent ions ($Yb^{3+}$, $Nd^{3+}$, and the like) for a luminescent center have been disclosed. Although these materials have a high luminescent intensity, shapes of the excitation spectra and the fluorescence spectra are sharp. Thus, the materials cannot be widely and successively used in a near-infrared region with a width of 100 to 200 nm, and there has been a problem when putting them to practical use.

Further, when looking at a currently widespread near-infrared LED, similarly to the above, the near-infrared LED has a high luminescent intensity, but shapes of the excitation spectrum and the fluorescence spectrum are sharp. Thus, there has been a problem in which the near-infrared LED cannot be sufficiently used in a near-infrared region unless it is combined with a plurality of LEDs having a different wavelength.

Accordingly, as to the near-infrared phosphor, there has been a demand of developing a near-infrared phosphor, which can be excited by visible light in a wide band to emit a broad fluorescence spectrum, and also to emit near-infrared light with high intensity.

Thus, the present invention is to provide a new phosphor which can be excited by visible light in a wide band to emit a broad fluorescence spectrum, and also to emit near-infrared light with high intensity.

SUMMARY OF THE INVENTION

The present invention proposes a phosphor, which is an oxide comprising Ca, Cu, and Si, wherein containing molar ratios of the elements are $0.15 \leq Ca/Si < 0.25$ and $0.13 \leq Cu/Si < 0.25$.

Further, the present invention proposes a phosphor, which is an oxide having a crystal phase composed of $CaCuSi_4O_{10}$ as a main crystal phase, wherein, in an X-ray diffraction (XRD) pattern obtained by powder XRD measurement using CuKα rays, a ratio (A/B) of a diffraction intensity A of the maximum peak appearing at a diffraction angle 2θ=23 to 24° with respect to a diffraction intensity B of the maximum peak appearing at a diffraction angle 2θ=26 to 27° is 1.70 or more.

Furthermore, the present invention proposes a phosphor, which is an oxide having a crystal phase composed of $CaCuSi_4O_{10}$ as a main crystal phase, wherein, in an X-ray diffraction (XRD) pattern obtained by powder XRD measurement using CuKα rays, a ratio (A/C) of a diffraction intensity A of the maximum peak appearing at a diffraction angle 2θ=23 to 24° with respect to a diffraction intensity C of the maximum peak appearing at a diffraction angle 2θ=27 to 27.5° is 3.50 or more.

Furthermore, the present invention proposes a phosphor, which is an oxide having a crystal phase composed of $CaCuSi_4O_{10}$ as a main crystal phase, wherein, in an X-ray diffraction (XRD) pattern obtained by powder XRD measurement using CuKα rays, a ratio (A/D) of a diffraction intensity A of the maximum peak appearing at a diffraction angle 2θ=23 to 24° with respect to a diffraction intensity D of the maximum peak appearing at a diffraction angle 2θ=27.5 to 28.5° is 9.00 or more.

Furthermore, the present invention proposes a phosphor, which is an oxide having a crystal phase composed of $CaCuSi_4O_{10}$ as a main crystal phase, wherein, in an X-ray diffraction (XRD) pattern obtained by powder XRD measurement using CuKα rays, a ratio (A/E) of a diffraction intensity A of the maximum peak appearing at a diffraction angle 2θ=23 to 24° with respect to a diffraction intensity E of the maximum peak appearing at a diffraction angle 2θ=39.5 to 40.5° is 5.00 or more.

The phosphor proposed by the present invention can be excited by visible light in a wide band to emit a broad fluorescence spectrum, and also to emit near-infrared light with high intensity. Thus, as described above, the phosphor proposed by the present invention can be suitably used as a phosphor constituting a luminescent device mounted on a near-infrared spectrometer or an optical coherence tomography (OCT), and further as a wavelength conversion material constituting a light-receiving device mounted on a solar battery, a solar power generator, or the like. In addition, the phosphor proposed by the present invention can be suitably used as a phosphor, which is contained in fluorescent paint used for a fluorescent paint printed product or a printed product capable of emitting near-infrared light.

BRIEF DESCRIPTION OF DRAWINGS

FIG. 1 is a diagram showing excitation spectra and fluorescence spectra of the phosphors (samples) obtained in Example 1 and Comparative Example 1. The spectra of Comparative Example 1 are shown as related intensity values when the maximum values of the excitation intensity and the fluorescence intensity on the vertical axis are taken as 1, and the spectra of Example 1 are shown as related intensity values with respect to the values of Comparative Example 1;

FIG. 2 is a diagram showing an XRD pattern of the phosphor (sample) obtained in Example 1;

FIG. 3 is a diagram showing an XRD pattern of the phosphor (sample) obtained in Example 4;

FIG. 4 is a diagram in which data of Examples 1 to 5 and Comparative Example 1 are plotted on the coordinates where the horizontal axis is a diffraction intensity ratio A/B and the vertical axis is a relative luminescent intensity;

FIG. 5 is a diagram in which data of Examples 1 to 5 and Comparative Example 1 are plotted on the coordinates where the horizontal axis is a diffraction intensity ratio A/C and the vertical axis is a relative luminescent intensity;

FIG. 6 is a diagram in which data of Examples 1 to 5 and Comparative Example 1 are plotted on the coordinates where the horizontal axis is a diffraction intensity ratio A/D and the vertical axis is a relative luminescent intensity; and FIG. 7 is a diagram in which data of Examples 1 to 5 and Comparative Example 1 are plotted on the coordinates where the horizontal axis is a diffraction intensity ratio A/E and the vertical axis is a relative luminescent intensity.

DETAILED DESCRIPTION OF THE INVENTION

Next, the present invention will be described based on embodiments for carrying out the present invention. However, the present invention is not limited to the embodiments that will be described below.

<Composition of the Present Phosphor>

It is preferable that the phosphor according to an example of the present embodiment (referred to as "present phosphor") is an oxide comprising Ca, Cu, and Si, and the containing molar ratios of the elements are $0.15 \leq Ca/Si < 0.25$ and $0.13 \leq Cu/Si < 0.25$.

The ratio Ca/Si of the present phosphor, that is, the containing molar ratio of Ca to Si is preferably 0.15 or more, since excessive formation of $SiO_2$ phases can be suppressed while maintaining a Ca amount required for forming the present phosphor, which largely contributes to the luminescence of near-infrared light, and the ratio Ca/Si is preferably less than 0.25, since excessive formation of sub-phases such as a $CaSiO_3$ phase and a $Ca_2SiO_4$ phase, which less contributes to the luminescence of near-infrared light, can be suppressed.

From such a viewpoint, the ratio Ca/Si of the present phosphor is preferably 0.15 or more and less than 0.25, more preferably 0.17 or more or 0.23 or less, even more preferably 0.18 or more or 0.21 or less.

Further, the ratio Cu/Si of the present phosphor, that is, the containing molar ratio of Cu to Si is preferably 0.13 or more, since a sufficient amount of Cu ions, which contributes to the luminescence of near-infrared light, can be solid-solubilized into the present phosphor, and the ratio Cu/Si is preferably less than 0.25, since formation of impurity phases such as a CuO phase and a $Cu_2O$ phase, which hinders the luminescence of near-infrared light, can be suppressed.

From such a viewpoint, the ratio Cu/Si of the present phosphor is preferably 0.13 or more and less than 0.25, more preferably 0.17 or more or 0.23 or less, even more preferably 0.18 or more or 0.21 or less.

It is preferable that the present phosphor has a relationship where the ratio Ca/Si is larger than the ratio Cu/Si, that is, Ca/Si>Cu/Si. The ratio Ca/Si is preferably larger than the ratio Cu/Si, since formation of impurity phases such as a CuO phase and a $Cu_2O$ phase, which absorbs visible light that is excitation light, and also absorbs emitted near-infrared light, can be suppressed.

It is preferable that the present phosphor has a crystal phase comprising a planar four-coordination structure in which four $O^{2-}$ ions are bonded around a $Cu^{2+}$ ion, and particularly has the crystal phase comprising the planar four-coordination structure as a main crystal phase.

The present phosphor preferably has the crystal phase comprising the planar four-coordination structure as a main crystal phase in particular, since the present phosphor can strongly absorb visible light, and emits energy as near-infrared light when the electrons, which are excited by the absorption of the visible light, returns to a ground state.

The crystal phase comprising the planar four-coordination structure in the present phosphor is preferably a crystal phase composed of $CaCuSi_4O_{10}$ (referred to as "$CaCuSi_4O_{10}$ crystal phase").

In so doing, whether or not the present phosphor has the $CaCuSi_4O_{10}$ crystal phase as a main crystal phase can be judged, in an X-ray diffraction (XRD) pattern obtained by powder XRD measurement using CuKα rays, by whether or not a maximum intensity of a diffraction peak derived from the $CaCuSi_4O_{10}$ crystal phase is larger than that of a diffraction peak derived from any other crystal phase.

In the case where the present phosphor has the $CaCuSi_4O_{10}$ crystal phase as a main crystal phase, it is preferable that the present phosphor further has a crystal phase composed of $SiO_2$ (referred to as "$SiO_2$ crystal phase").

When the present phosphor has the $SiO_2$ crystal phase, scattering of the excitation light can be prevented, and a higher fluorescence spectrum intensity can be obtained.

In the present phosphor, a part of Ca or Cu in the $CaCuSi_4O_{10}$ crystal phase may be substituted by the other element, or the part of Ca or Cu may be deficient to the extent that the effect of the present phosphor is not disturbed. For example, the part of Ca or Cu may be substituted by one or two of Ba and Sr. This is because, by containing these phases, neither an advantage nor a disadvantage is confirmed at the present time.

In addition, a part of Cu in the $CaCuSi_4O_{10}$ crystal phase may be substituted by one or two of Mg and Zn.

This is because, even when a part of Cu is substituted by one or two of Mg and Zn, it is conceivable that luminescence at a local structure of Cu ($CuO_4$) is not inhibited. Further, by forming $MgO_4$ or $ZnO_4$ in the crystal phase as a local structure, self-absorption of luminescence by adjacent $CuO_4$ each other can be prevented, and thus an improvement of quantum efficiency can be expected.

Meanwhile, when the present phosphor has the $CaCuSi_4O_{10}$ crystal phase as a main crystal phase, the present phosphor may have a crystal phase other than the $CaCuSi_4O_{10}$ crystal phase and the $SiO_2$ crystal phase. Also, the present phosphor may have a component which cannot be detected by XRD.

It is preferable that the present phosphor does not contain a rare earth element. Meanwhile, in the case of containing a rare earth element, the content is preferably less than 1% by mass.

The present phosphor may contain a component comprising one or two or more elements selected from the group consisting of Li, Na, K, B, P, F, Cl, Br, and I. In so doing, the contents of these elements are preferably 0.005 to 3% by mass. Among others, it is more preferably 0.008% by mass or more or 2% by mass or less, even more preferably 0.01% by mass or more or 1% by mass or less.

When the present phosphor contains an appropriate amount of these elements, it can be expected that the luminescent peak intensity can be consequently enhanced.

Meanwhile, it can be assumed that the element is added and contained in the present phosphor, for example, as a part of a sintering aid in producing the present phosphor for the purpose of promoting the reaction and promoting or suppressing the calcination.

The present phosphor may contain a component comprising an element other than the above. In this case, when the content is less than about 5% by mass with respect to the present phosphor, within which less than 3% by mass, of which less than 1% by mass, it can be considered that the characteristics of the present phosphor are not affected by the other element components in such an amount.

<X-Ray Diffraction of the Present Phosphor>

In the present phosphor, in an X-ray diffraction (XRD) pattern obtained by measuring with a powder XRD measurement apparatus using CuKα rays, a ratio (A/B) of a diffraction intensity A of the maximum peak appearing at a diffraction angle 2θ=23 to 24°, that is, a diffraction peak derived from a crystal plane ([004] plane) of the $CaCuSi_4O_{10}$ crystal lattice, with respect to a diffraction intensity B of the maximum peak appearing at a diffraction angle 2θ=26 to 27°, that is, a diffraction peak derived from a crystal plane ([104] plane) of the $CaCuSi_4O_{10}$ crystal lattice is preferably 1.70 or more.

When the present phosphor contains the $CaCuSi_4O_{10}$ crystal phase in such a range, the fluorescence spectrum intensity can be enhanced.

From such a viewpoint, the diffraction intensity ratio A/B is preferably 1.70 or more, more preferably 1.90 or more, even more preferably 2.00 or more. Experientially, the upper limit of the diffraction intensity ratio A/B is preferably about 4.50, more preferably 4.00.

In order to adjust the diffraction intensity ratio A/B, temperature and time of the calcination, an additive amount of flux, and the like may be adjusted in an appropriate range, or the molar ratio of Ca/Si or Cu/Si may be adjusted in an appropriate range. However, it is not limited to those methods.

Further, in the present phosphor, in an X-ray diffraction (XRD) pattern obtained by measuring with a powder XRD measurement apparatus using CuKα rays, a ratio (A/C) of a diffraction intensity A of the maximum peak appearing at a diffraction angle 2θ=23 to 24°, that is, a diffraction peak derived from a crystal plane ([004] plane) of the $CaCuSi_4O_{10}$ crystal lattice, with respect to a diffraction intensity C of the maximum peak appearing at a diffraction angle 2θ=27 to 27.5°, that is, a diffraction peak derived from a crystal plane ([202] plane) of the $CaCuSi_4O_{10}$ crystal lattice is preferably 3.50 or more.

When the present phosphor contains the $CaCuSi_4O_{10}$ crystal phase in such a range, the fluorescence spectrum intensity can be enhanced.

From such a viewpoint, the diffraction intensity ratio A/C is preferably 3.50 or more, more preferably 4.50 or more, even more preferably 6.00 or more. Experientially, the upper limit of the diffraction intensity ratio A/C is preferably about 20.00, more preferably 16.00.

In order to adjust the diffraction intensity ratio A/C, temperature and time of the calcination, an additive amount of flux, and the like may be adjusted in an appropriate range, or the molar ratio of Ca/Si or Cu/Si may be adjusted in an appropriate range. However, it is not limited to those methods.

Furthermore, in the present phosphor, in an X-ray diffraction (XRD) pattern obtained by measuring with a powder XRD measurement apparatus using CuKα rays, a ratio (A/D) of a diffraction intensity A of the maximum peak appearing at a diffraction angle 2θ=23 to 24°, that is, a diffraction peak derived from a crystal plane ([004] plane) of the $CaCuSi_4O_{10}$ crystal lattice, with respect to a diffraction intensity D of the maximum peak appearing at a diffraction angle 2θ=27.5 to 28.5°, that is, a diffraction peak derived from a crystal plane ([211] plane) of the $CaCuSi_4O_{10}$ crystal lattice is preferably 9.00 or more.

When the present phosphor contains the $CaCuSi_4O_{10}$ crystal phase in such a range, the fluorescence spectrum intensity can be enhanced.

From such a viewpoint, the diffraction intensity ratio A/D is preferably 9.00 or more, more preferably 12.00 or more, even more preferably 15.00 or more. Experientially, the upper limit of the diffraction intensity ratio A/D is preferably about 50.00, more preferably 36.00.

In order to adjust the diffraction intensity ratio A/D, temperature and time of the calcination, an additive amount of flux, and the like may be adjusted in an appropriate range, or the molar ratio of Ca/Si or Cu/Si may be adjusted in an appropriate range. However, it is not limited to those methods.

Further, in the present phosphor, in an X-ray diffraction (XRD) pattern obtained by measuring with a powder XRD measurement apparatus using CuKα rays, a ratio (A/E) of a diffraction intensity A of the maximum peak appearing at a diffraction angle 2θ=23 to 24°, that is, a diffraction peak derived from a crystal plane ([004] plane) of the $CaCuSi_4O_{10}$ crystal lattice, with respect to a diffraction intensity E of the maximum peak appearing at a diffraction angle 2θ=39.5 to 40.5°, that is, a diffraction peak derived from a crystal plane ([116] plane) of the $CaCuSi_4O_{10}$ crystal lattice is preferably 5.00 or more.

When the present phosphor contains the $CaCuSi_4O_{10}$ crystal phase in such a range, the fluorescence spectrum intensity can be enhanced.

From such a viewpoint, the diffraction intensity ratio A/E is preferably 5.00 or more, more preferably 6.00 or more, even more preferably 6.50 or more. Experientially, the upper limit of the diffraction intensity ratio A/E is preferably about 20.00, more preferably 13.00.

In order to adjust the diffraction intensity ratio A/E, temperature and time of the calcination, an additive amount of flux, and the like may be adjusted in an appropriate range, or the molar ratio of Ca/Si or Cu/Si may be adjusted in an appropriate range. However, it is not limited to those methods.

<Form of the Present Phosphor>

The present phosphor is not limited to the forms such as a film shape, a plate shape, and a particle shape. However, from the viewpoint of workability to a luminescent device-mounted unit or a printed product to be used, the form of the present phosphor is preferably a particle shape.

<Production Method of the Present Phosphor>

The present phosphor can be produced by the following production method. However, the production method of the present phosphor is not limited to the production method to be described below.

The present phosphor can be obtained by mixing a Ca raw material, a Cu raw material, and a Si raw material, adding flux such as a sintering aid if necessary, and calcining the mixture.

In so doing, examples of the Ca raw material may include an oxide, a carbonate, a nitrate, and an acetate of Ca.

Examples of the Cu raw material may include an oxide, a carbonate, a sulfate, and a metal of Cu.

Examples of the Si raw material may include an oxide, a carbide, a nitride, and a silicon of Si.

Incidentally, from the viewpoint of keeping a divalent oxidation number of Cu, it is preferable that a reducing agent is not added.

A blending ratio (molar ratio) of the Ca raw material and the Si raw material is preferably 1:3 to 1:7. Among others, it is more preferably 1:4 to 1:6, even more preferably 1:4.5 to 1:5.5.

Also, a blending ratio (molar ratio) of the Cu raw material and the Si raw material is preferably 1:3 to 1:7. Among others, it is more preferably 1:4 to 1:6, even more preferably 1:4.5 to 1:5.5.

One of the characteristics of the production method of the present phosphor is that the blending ratio of the Si raw material is large, as compared with the case where the crystal phase represented by $CaCuSi_2O_6$ is a main crystal phase. However, as in Example 5 that will be described below, in the case of performing an acid washing in a post step and the like, the blending ratio of the Si raw material may also be smaller than the stoichiometric ratio (Ca:Si=1:4).

By blending a flux such as a sintering acid, a chemical reaction can be promoted, and thus unreacted substances can be reduced.

Examples of the flux may include a flux containing one or two or more elements selected from the group consisting of Li, Na, K, B, P, F, Cl, Br, and I. Among others, Li, Na, K, B, F, Cl, and the like are particularly preferred.

A blending amount (mass ratio) of the flux is preferably 0.01 to 15% with respect to a total weight obtained by mixing the Ca raw material, the Cu raw material, and the Si raw material. Among others, it is more preferably 0.5% or more or 10% or less, even more preferably 2% or more or 7% or less.

As for the calcination atmosphere, any atmosphere can be appropriately employed unless it is not a reducing atmosphere. For example, an inert gas atmosphere, an air atmosphere, an acidic atmosphere, and the like can be employed.

The calcination temperature is preferably 700° C. to 1,100° C. This is because, when the temperature is 700° C. or more, the reaction is easily progressed, and when the temperature is 1,100° C. or less, the melting is easily suppressed. Further, the calcination temperature is more preferably 950° C. or more. This is because, when the temperature is 950° C. or more, the molar ratio of Ca/Si after the calcination can be larger than the molar ratio of Cu/Si.

In addition, the calcination may be repeated several times. That is, for example, the first calcination is performed in a temperature range of 700 to 900° C., the calcined powder thus obtained is crushed, and then the second calcination can be also performed in a temperature range of 800 to 1,100° C. The temperature in the second calcination is preferably higher than the temperature in the first calcination.

Further, the calcined powder is washed with an acidic solution such as water or hydrochloric acid after the first calcination, and then the second calcination can be also performed. By doing so, the blending amount of the sintering aid can be more appropriately adjusted to each calcination step, and thus the element contents of Li, Na, K, B, P, F, Cl, Br, and I contained in the present phosphor as a final product can be also easily controlled in an appropriate range.

<Characteristics of the Present Phosphor>

In the preferred embodiment of the present phosphor, the present phosphor has characteristics of being excited by visible light in a wavelength region having strong energy (450 to 750 nm). For more efficient luminescence, it is preferable that the present phosphor is excited by visible light in a range of 500 to 700 nm, particularly in a range of 580 to 660 nm. It is preferable that, in the present phosphor, the excitation intensity is large in the wavelength region, particularly in the entire wavelength region.

In the preferred embodiment of the present phosphor, the present phosphor has a peak wavelength in an infrared region of 800 to 1,200 nm. Thus, a strong luminescent intensity can be obtained in an infrared region of 850 to 980 nm, and a further strong luminescent intensity can be obtained in an infrared region of 880 to 950 nm.

In the preferred embodiment of the present phosphor, the present phosphor also has characteristics that the half value width of the fluorescence spectrum is more than 100 nm (125 nm in FIG. 1).

Accordingly, the present phosphor can be excited by visible light in a wide band to emit a broad fluorescence spectrum, and also to emit near-infrared light with high intensity.

<Applications>

The present phosphor can be used for near-infrared luminescent devices since the present phosphor is excited by visible light and can emit near-infrared light.

For example, when the present phosphor is used in combination with a red LED having a luminescent peak at 630 nm, a near-infrared LED light source having superior energy efficiency can be provided. Also, the present phosphor can be used in combination with a generic white LED, blue LED, green LED, and the like.

Further, the present phosphor can be suitably used as a phosphor constituting a luminescent device mounted on luminescent device-mounted units such as a near-infrared spectrometer and an optical coherence tomography (OCT), and as a wavelength conversion material constituting a light-receiving device mounted on light-receiving device-mounted units such as a solar power generator. In so doing, when a near-infrared light source can be downsized and used in combination with an endoscope, there is a possibility of expanding a diagnosis target, which has been limited to, such as an eye or an oral cavity according to an optical coherence tomography (OCT) method.

In the case of using the present phosphor, for example, the present phosphor is mixed with an organic resin or an inorganic filler, for example, glass particles (for example, silica particles), a metal oxide or the like, and further a solvent, a dispersant or the like if necessary, coated and formed as a liquid composition, and then solidified via drying or/and curing. Thus, the present phosphor can be used as a form of a phosphor composition layer, a phosphor composition filler, or the like.

When the near-infrared luminescent device containing the present phosphor (referred to as "present near-infrared luminescent device") is used for a spectrometer, the spectrometer can be used for an evaluation apparatus of biological objects, fruits, vegetables, and the like.

In the spectrometer, the present phosphor is mounted as a wavelength conversion material of a near-infrared light source.

In addition, when the light-receiving device containing the present phosphor is used for a solar power generator, a visible light component of sunlight can be converted into near-infrared light, and thus the power generation efficiency can be further enhanced.

In a solar spectrometer, the present phosphor can be mounted as a wavelength conversion material on a light-receiving side. Particularly, it is known that a light-receiving device using a silicon photo-diode has high spectral sensitivity in a wavelength band of near-infrared light of 800 to 1,000 nm, and thus the present phosphor is suitable as a wavelength conversion material having an excellent matching property with 900 to 950 nm, which is a peak wavelength band of near-infrared luminescence of the present phosphor.

Meanwhile, since the present phosphor emits near-infrared light even when electron rays, X-rays, and the like are used as an excitation source, for example, when using X-rays as an excitation source, applications into an X-ray diagnostic apparatus for medical or security as a scintillation material, or the like are possible.

In addition, a fluorescent paint can also be produced using the present phosphor. For example, when the fluorescent paint is applied for forgery-proof ink, near-infrared light can be detected by irradiating with an visible light lamp, and thus authenticity determinations of paper-money, passports, valuable papers, cards, valuable printed matters, electronic components, and clothes are made possible. In particular, since the near-infrared luminescent spectrum has an extremely rare broad shape, the fluorescent paint using the present phosphor can be clearly distinguished from existing forgery-proof ink, and the authenticity determinations with very high accuracy are made possible.

For example, a fluorescent paint printed product which is used for forgery-proof printing utilized for paper-money or the like can be produced, and then novel forgery-proof printing in which the forgery, which cannot be detected with the naked eye, can be detected by a solid-state imaging device using a photo-diode made of silicon, InGaAs or the like, or equipment using a photomultiplier tube, can be performed.

Further, near-infrared fluorescent pigment can be utilized for copy prevention printing or illicit photographing prevention printing by containing the same in a document containing confidential information, poster paper, or a substrate. In other words, when photographing with a digital camera or a copying machine, the fluorescent pigment is excited by visible light such as illumination light or flash light to emit near-infrared light, and when the near-infrared light is detected by a solid-state imaging device using a photo-diode made of silicon or the like, the near-infrared light is reflected together with a photographing object, and thus the photographing can be hindered.

These fluorescent paints are mixed with a fluidity adjusting material of inorganic components or organic components, an organic solvent, or the like, as setting transparent resin components as matrix in addition to the present phosphor, and may be prepared as ink or paste. In so doing, examples of the resin component may include an epoxy resin, a phenol resin, a silicone resin, an acrylic resin, and a polyolefin resin. Additionally, glass particles, which are light scattering components, may be mixed if necessary.

Explanation of Words and Phrases

In the present invention, when the term "X to Y" (X and Y are arbitrary numbers) is expressed, unless particularly stated otherwise, the expression includes the meaning of "X or more and Y or less", as well as the meaning of "preferably more than X" or "preferably less than Y".

Further, when the term "X or more" (X is an arbitrary number) or "Y or less" (Y is an arbitrary number) is expressed, the expression includes the meaning of "more than X is preferable" or "less than Y is preferable".

EXAMPLES

Hereinafter, the present invention will be described in further detail based on the examples and comparative examples described below.

<XRD Measurement>

Each of the phosphors (samples) obtained in Examples and Comparative Examples served as a sample for powder X-ray diffraction measurement (XRD). The sample was mounted on a holder, and angles and intensities of the diffracted rays were measured using MXP18 (manufactured by Bruker AXS) under the following conditions, thereby obtaining an XRD pattern.

(Tube) CuKα ray
(Tube voltage) 40 kV
(Tube current) 150 mA
(Sampling interval) 0.02°
(Scanning speed) 4.0°/min
(Initiation angle) 5.02°
(Termination angle) 80°

<Measurement of Fluorescence Characteristics>

Each of the phosphors (samples) obtained in Examples and Comparative Examples served as a sample for luminescent characteristics measurement, and an excitation spectrum and a fluorescence spectrum were measured using a spectrofluorometer (FP-8700, manufactured by JASCO Corp.) under conditions where the band widths of both the excitation side and the fluorescence side were 10 nm and the scanning speed was 1,000 nm/min. An excitation wavelength of the fluorescence spectrum was 625 nm, and a monitoring wavelength of the excitation spectrum was a maximum luminescent wavelength (peak wavelength) of the fluorescence spectrum of each of the samples.

Then, as shown in Table 1, the peak intensity of the fluorescence spectrum of each of the samples was described as a relative luminescent intensity, when the peak intensity of the fluorescence spectrum of the sample in Comparative Example 1 was taken as 1.0.

Example 1

Calcium carbonate, basic copper carbonate, and silicon dioxide were mixed so as to be a molar ratio of 0.80:0.80: 4.0. As a flux, sodium carbonate in an amount to be 5% by mass with respect to the mixture was further added thereto and mixed. The mixture was put in an alumina crucible, preliminarily calcined at 850° C. for 12 hours under the air, and crushed in a mortar after the preliminary calcination. Thereafter, the resultant crushed article was calcined at 1,000° C. for 3 hours under the air, thereby obtaining a phosphor (sample).

An XRD pattern of the obtained phosphor (sample) is shown in FIG. 2.

The obtained phosphor (sample) was a compound composed of a crystal phase of $CaCuSi_4O_{10}$ comprising a planar four-coordination structure in which four $O^{2-}$ ions are bonded around a $Cu^{2+}$ ion as a main crystal phase, and having a $SiO_2$ phase as the other crystal phase.

A Na amount contained in the compound was 1.7% by mass. An inductively coupled plasma emission spectroscopy method (hereinafter referred to as "ICP") was used for the measurement of Na amount (the same applied to Examples that will be described below).

Example 2

Calcium carbonate, basic copper carbonate, and silicon dioxide were mixed so as to be a molar ratio of 0.85:0.80:4.0. As a flux, sodium tetraborate in an amount to be 5% by mass with respect to the mixture was further added thereto and mixed. The mixture was put in an alumina crucible, preliminarily calcined at 850° C. for 16 hours under the air, and crushed in a mortar after the preliminary calcination. Thereafter, the resultant crushed article was calcined at 1,000° C. for 3 hours in an oxygen atmosphere, thereby obtaining a phosphor (sample).

The obtained phosphor (sample) was a compound composed of the crystal phase of $CaCuSi_4O_{10}$ as a main crystal phase, and having a $SiO_2$ phase as the other crystal phase.

A Na amount contained in the compound was 1.5% by mass.

Example 3

Calcium carbonate, copper (II) oxide, and silicon dioxide were mixed so as to be a molar ratio of 0.75:0.75:4.0. As a flux, sodium chloride in an amount to be 5% by mass with respect to the mixture was further added thereto and mixed. The mixture was put in an alumina crucible, preliminarily calcined at 850° C. for 8 hours under the air, and crushed in a mortar after the preliminary calcination. Thereafter, the resultant crushed article was calcined at 1,000° C. for 3 hours under the air, thereby obtaining a phosphor (sample).

The obtained phosphor (sample) was a compound composed of the crystal phase of $CaCuSi_4O_{10}$ as a main crystal phase, and having a $SiO_2$ phase as the other crystal phase.

A Na amount contained in the compound was 1.6% by mass.

Example 4

Calcium carbonate, copper (II) oxide, and silicon dioxide were mixed so as to be a molar ratio of 0.95:0.80:4.0. As a flux, sodium chloride in an amount to be 5% by mass with respect to the mixture was further added thereto and mixed. The mixture was put in an alumina crucible, and calcined at 1,000° C. for 12 hours under the air, thereby obtaining a phosphor (sample).

An XRD pattern of the obtained phosphor (sample) is shown in FIG. 3.

The obtained phosphor (sample) was a compound composed of the crystal phase of $CaCuSi_4O_{10}$ as a main crystal phase, and having a $SiO_2$ phase as the other crystal phase.

A Na amount contained in the compound was 1.6% by mass.

Example 5

Calcium carbonate, basic copper carbonate, and silicon dioxide were mixed so as to be a molar ratio of 1.0:1.0:4.0. As a flux, sodium tetraborate in an amount to be 5% by mass with respect to the mixture was further added thereto and mixed.

The mixture was put in an alumina crucible, and preliminarily calcined at 850° C. for 4 hours under the air. After the preliminary calcination, the resultant calcined article was stirred and washed in a dilute hydrochloric acid solution of 0.1 mol/L for 2 hours, and then filtered and dried. Thereafter, the resultant dried article was put in an alumina crucible, and calcined at 1,000° C. for 3 hours under the air, thereby obtaining a phosphor (sample).

The obtained phosphor (sample) was a compound composed of the crystal phase of $CaCuSi_4O_{10}$ as a main crystal phase, and having a $SiO_2$ phase as the other crystal phase.

A Na amount contained in the compound was 0.05% by mass.

Comparative Example 1

Calcium carbonate, basic copper carbonate, and silicon dioxide were mixed so as to be a molar ratio of 1.0:1.0:4.0. The mixture was then put in an alumina crucible, and calcined at 850° C. for 16 hours under the air, thereby obtaining a phosphor (sample).

The obtained phosphor (sample) was a compound composed of a single phase comprising a crystal phase of $CaCuSi_4O_{10}$.

A Na amount contained in the compound was 1.0% by mass.

TABLE 1

| | Composition of product (molar ratio) | | XRD $SiO_2$ phase presence/ | Peak intensity ratio of XRD | | | | Relative luminescent intensity |
|---|---|---|---|---|---|---|---|---|
| | Ca/Si | Cu/Si | absence | A/B | A/C | A/D | A/E | (Ex. 625 nm) |
| Example 1 | 0.205 | 0.195 | presence | 3.69 | 14.16 | 34.78 | 8.60 | 2.1 |
| Example 2 | 0.208 | 0.193 | presence | 3.25 | 10.54 | 33.35 | 11.46 | 2.2 |
| Example 3 | 0.183 | 0.180 | presence | 2.19 | 6.01 | 15.07 | 6.52 | 2.0 |
| Example 4 | 0.233 | 0.195 | presence | 1.73 | 4.08 | 11.62 | 5.78 | 1.7 |
| Example 5 | 0.153 | 0.133 | presence | 1.70 | 3.50 | 9.02 | 5.12 | 1.2 |
| Comparative Example 1 | 0.258 | 0.258 | absence | 1.68 | 3.15 | 7.43 | 4.70 | 1.0 |

(Consideration)

FIG. 1 is a diagram showing the excitation spectra and the fluorescence spectra of the phosphors (samples) obtained in Example 1 and Comparative Example 1. The spectra of Comparative Example 1 are shown as related intensity values when the maximum values of the excitation intensity and the fluorescence intensity on the vertical axis are taken as 1, and the spectra of Example 1 are shown as related intensity values with respect to the values of Comparative Example 1.

As such, all of the phosphors (samples) obtained in Examples 1 to 5 have characteristics of being excited by visible light in a range of at least 450 to 750 nm, and emitting near-infrared light in a range of at least 800 to 1,200 nm. As shown in Table 1, it can be confirmed that the relative luminescent intensity of Examples 1 to 5 respectively is large as compared with that of Comparative Example 1. In other words, it can be confirmed that all of the phosphors (samples) obtained in Examples 1 to 5 can be excited by visible light in a wide band to emit a broad fluorescence spectrum, and also to emit near-infrared light with high intensity.

From the results of Examples as described above and results of various tests carried out by the inventors, it is found that, when the phosphor is an oxide comprising Ca, Cu, and Si and the containing molar ratios of the elements are 0.15≤Ca/Si<0.25 and 0.13≤Cu/Si<0.25, the phosphor can be excited by visible light in a range of 450 to 750 nm, and can emit near-infrared light in a range of 800 to 1,200 nm.

Further, from FIG. 4, it is found that, in the phosphor, the ratio (A/B) of the diffraction intensity A of the maximum peak appearing at the diffraction angle 2θ=23 to 24° with respect to the diffraction intensity B of the maximum peak appearing at the diffraction angle 2θ=26 to 27° is preferably 1.70 or more, more preferably 1.90 or more, even more preferably 2.00 or more.

From FIG. 5, it is found that, in the phosphor, the ratio (A/C) of the diffraction intensity A of the maximum peak appearing at the diffraction angle 2θ=23 to 24° with respect to the diffraction intensity C of the maximum peak appearing at the diffraction angle 2θ=27 to 27.5° is preferably 3.50 or more, more preferably 4.50 or more, even more preferably 6.00 or more.

From FIG. 6, it is found that, in the phosphor, the ratio (A/D) of the diffraction intensity A of the maximum peak appearing at the diffraction angle 2θ=23 to 24° with respect to the diffraction intensity D of the maximum peak appearing at the diffraction angle 2θ=27.5 to 28.5° is preferably 9.00 or more, more preferably 12.00 or more, even more preferably 15.00 or more.

Further, from FIG. 7, it is found that, in the phosphor, the ratio (A/E) of the diffraction intensity A of the maximum peak appearing at the diffraction angle 2θ=23 to 24° with respect to the diffraction intensity E of the maximum peak appearing at the diffraction angle 2θ=39.5 to 40.5° is preferably 5.00 or more, more preferably 6.00 or more, even more preferably 6.50 or more.

The invention claimed is:

1. A phosphor, which is an oxide comprising Ca, Cu, and Si, wherein containing molar ratios of the elements are 0.15≤Ca/Si<0.25 and 0.13≤Cu/Si<0.25 and the ratio of Ca/Si is larger than the ratio of Cu/Si,
wherein the oxide has a crystal phase composed of $CaCuSi_4O_{10}$ and comprising a planar four-coordination structure in which four $O^{2-}$ ions are bonded around a $Cu^{2+}$ ion as a main crystal phase and a further crystal phase composed of $SiO_2$, and
wherein an amount of the main crystal phase present in the oxide is greater than an amount of any other crystal phase present in the oxide.

2. The phosphor according to claim 1, which is excited by visible light in a range of at least 450 to 750 nm, and emits near-infrared light in a range of at least 800 to 1,200 nm.

3. The phosphor according to claim 1, wherein a rare earth element is not contained.

4. The phosphor according to claim 1, wherein in an X-ray diffraction (XRD) pattern obtained by powder XRD measurement using CuKα rays, a ratio (A/B) of a diffraction intensity A of he a maximum peak appearing at a diffraction angle 2θ=23 to 24° with respect to a diffraction intensity B of a maximum peak appearing at a diffraction angle 2θ=26 to 27° is 1.70 or more.

5. The phosphor according to claim 1, wherein in an X-ray diffraction (XRD) pattern obtained by powder XRD measurement using CuKα rays, a ratio (A/C) of a diffraction intensity A of a maximum peak appearing at a diffraction angle 2θ=23 to 24° with respect to a diffraction intensity C of a maximum peak appearing at a diffraction angle 2θ=27 to 27.5° is 3.50 or more.

6. The phosphor according to claim 1, wherein in an X-ray diffraction (XRD) pattern obtained by powder XRD measurement using CuKα rays, a ratio (A/D) of a diffraction intensity A of a maximum peak appearing at a diffraction angle 2θ=23 to 24° with respect to a diffraction intensity D of a maximum peak appearing at a diffraction angle 2θ=27.5 to 28.5° is 9.00 or more.

7. The phosphor according to claim 1, wherein in an X-ray diffraction (XRD) pattern obtained by powder XRD measurement using CuKα rays, a ratio (A/E) of a diffraction intensity A of a maximum peak appearing at a diffraction angle 2θ=23 to 24° with respect to a diffraction intensity E of a maximum peak appearing at a diffraction angle 2θ=39.5 to 40.0° is 5.00 or more.

8. A phosphor, which is an oxide having a crystal phase composed of $CaCuSi_4O_{10}$ as a main crystal phase, wherein an amount of the main crystal phase present in the oxide is greater than an amount of any other crystal phase present in the oxide and in an X-ray diffraction (XRD) pattern obtained by powder XRD measurement using CuKα rays, a ratio (A/B) of a diffraction intensity A of a maximum peak appearing at a diffraction angle 2θ=23 to 24° with respect to a diffraction intensity B of a maximum peak appearing at a diffraction angle 2θ=26 to 27° is 1.70 or more.

9. A phosphor, which is an oxide having a crystal phase composed of $CaCuSi_4O_{10}$ as a main crystal phase, wherein an amount of the main crystal phase present in the oxide is greater than an amount of any other crystal phase present in the oxide and in an X-ray diffraction (XRD) pattern obtained by powder XRD measurement using CuKα rays, a ratio (A/C) of a diffraction intensity A of a maximum peak appearing at a diffraction angle 2θ=23 to 24° with respect to a diffraction intensity C of a maximum peak appearing at a diffraction angle 2θ=27 to 27.5° is 3.50 or more.

10. A phosphor, which is an oxide having a crystal phase composed of $CaCuSi_4O_{10}$ as a main crystal phase, wherein an amount of the main crystal phase present in the oxide is greater than an amount of any other crystal phase present in the oxide and in an X-ray diffraction (XRD) pattern obtained by powder XRD measurement using CuKα rays, a ratio (A/D) of a diffraction intensity A of a maximum peak appearing at a diffraction angle 2θ=23 to 24° with respect to a diffraction intensity D of a maximum peak appearing at a diffraction angle 2θ=27.5 to 28.5° is 9.00 or more.

11. A phosphor, which is an oxide having a crystal phase composed of $CaCuSi_4O_{10}$ as a main crystal phase, wherein an amount of the main crystal phase present in the oxide is greater than an amount of any other crystal phase present in the oxide and in an X-ray diffraction (XRD) pattern obtained by powder XRD measurement using CuKα rays, a ratio (A/E) of a diffraction intensity A of a maximum peak appearing at a diffraction angle 2θ=23 to 24° with respect to a diffraction intensity E of a maximum peak appearing at a diffraction angle 2θ=39.5 to 40.0° is 5.00 or more.

12. A near-infrared luminescent device, comprising the phosphor according to claim 1.

13. A unit comprising the near-infrared luminescent device according to claim 12.

14. A fluorescent paint comprising the phosphor according to claim 1.

15. A phosphor printed product using the fluorescent paint according to claim 14.

* * * * *

UNITED STATES PATENT AND TRADEMARK OFFICE
CERTIFICATE OF CORRECTION

PATENT NO. : 11,292,964 B2
APPLICATION NO. : 16/084744
DATED : April 5, 2022
INVENTOR(S) : Ikuhiro Ozawa et al.

It is certified that error appears in the above-identified patent and that said Letters Patent is hereby corrected as shown below:

In the Claims

Column 14, Line 15, Claim 4, delete "he a" and insert -- a --

Column 14, Line 39, Claim 7, delete "40.0°" and insert -- 40.5° --

Signed and Sealed this
Twenty-fifth Day of October, 2022

Katherine Kelly Vidal
*Director of the United States Patent and Trademark Office*